US006642075B2

(12) United States Patent
Takiguchi

(10) Patent No.: US 6,642,075 B2
(45) Date of Patent: Nov. 4, 2003

(54) METHOD FOR MANUFACTURING SEMICONDUCTOR LASER DEVICE

(75) Inventor: Tohru Takiguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/202,023

(22) Filed: Jul. 25, 2002

(65) Prior Publication Data

US 2003/0170924 A1 Sep. 11, 2003

(30) Foreign Application Priority Data

Mar. 5, 2002 (JP) .................................. 2002-058804

(51) Int. Cl.[7] .............................................. H01L 21/00
(52) U.S. Cl. ........................................ 438/32; 372/45
(58) Field of Search ....................... 372/43–50; 438/32

(56) References Cited

U.S. PATENT DOCUMENTS

| | | | | |
|---|---|---|---|---|
| 5,093,835 A | * | 3/1992 | Takemoto et al. | 372/45 |
| 5,444,730 A | * | 8/1995 | Mizutani | 372/45 |
| 5,692,001 A | * | 11/1997 | Tiemeijer | 372/44 |
| 2002/0061046 A1 | | 5/2002 | Takiguchi et al. | |

FOREIGN PATENT DOCUMENTS

| | | |
|---|---|---|
| JP | 62-139503 | 6/1987 |
| JP | 6-291408 | 10/1994 |

OTHER PUBLICATIONS

Aoki, M. et al.; "85° C.–10Gbits operation of 1.3–$\mu$m InGaAlAs MQW–DFB laser", *Proc. of ECOC*, pp. 123–124 (2000).

* cited by examiner

*Primary Examiner*—Douglas A. Wille
(74) *Attorney, Agent, or Firm*—Leydig, Voit & Mayer, LTD

(57) ABSTRACT

On a laminate containing a p-InGaAsP layer, one of layers including a diffraction grating layer, an $SiO_2$ insulating film pattern that has first rectangular openings, each opening having a long side orthogonal with the direction of the optical wave guide, periodically arranged at intervals in the direction of the optical wave guide is formed. An SiN insulating film pattern having a second opening with a strip shape having a width narrower than the long side of the first opening, extending in the direction of the optical wave guide, is formed on the $SiO_2$ insulating film pattern. The laminate containing the p-InGaAsP layer is dry-etched using the $SiO_2$ insulating film pattern and the SiN insulating film pattern as masks, and methane and a hydrogen plasma as the etching media.

6 Claims, 15 Drawing Sheets ic laser, etching of a diffraction grating layer having the same width as the ridge width is performed using an SiO₂ film mask pattern having an opening of a diffraction grating shape wider than the ridge width, and a resist pattern formed on the SiO₂ film mask pattern having an opening with the same width as the ridge width extending in the direction of the optical wave guide.

METHOD FOR MANUFACTURING SEMICONDUCTOR LASER DEVICE

BACKGROUND OF THE INVENTION

1. Field of the Invention

The present invention relates to a method for manufacturing a semiconductor laser device, and more specifically, to a method for manufacturing a distributed feedback semiconductor laser device.

2. Description of the Related Art

In a related-art distributed feedback semiconductor laser (hereinafter referred to as "DFB laser") comprising a optical-wave guide ridge having a diffraction grating formed therein, when the diffraction grating is formed as a part of the steps in the method for manufacturing a semiconductor laser, etching of a diffraction grating layer having the same width as the ridge width is performed using an SiO₂ film mask pattern having an opening of a diffraction grating shape wider than the ridge width, and a resist pattern formed on the SiO₂ film mask pattern having an opening with the same width as the ridge width extending in the direction of the optical wave guide.

A related-art method for manufacturing a diffraction grating will be described.

FIGS. 33, 35, and 39 are plans of a semiconductor laser showing a step in a related-art method for manufacturing a semiconductor laser, for example, disclosed in Japanese Patent Application No. 2000-352450; FIG. 34 is a sectional view of the semiconductor laser along line 34—34 in FIG. 33; FIG. 36 is a sectional view of the semiconductor laser along line 36—36 in FIG. 35; FIG. 37 is a sectional view of the semiconductor laser along line 37—37 in FIG. 35; FIG. 38 is a sectional view of the semiconductor laser along line 38—38 in FIG. 35; and FIG. 40 is a sectional view of the semiconductor laser along line 40—40 in FIG. 39.

First, on an n-type InP substrate (hereinafter "n-type" and "p-type" are described as "n-" and "p-", respectively), an n-InP clad layer, an n-AlInAs clad layer, an n-AlGaInAs light-confinement layer, an AlGaInAs quantum-well layer, a p-AlGaInAs light-confinement layer, a p-AlInAs clad layer, a p-InP layer, a p-InGaAsP layer, and a p-InP layer are laminated and grown. Then, an SiO₂ insulating film is formed, and a resist film is grown thereon.

Next, EB exposure is performed at a pitch p10 of about 2000 Å and a width of 10 μm (½ the pitch p10, 1000 Å for the exposed portion) and development is performed to form a resist pattern, the SiO₂ insulating film is etched using the resist pattern to form an SiO₂ insulating film pattern, and the resist pattern is removed. The result of this process is shown in FIGS. 33 and 34.

In FIGS. 33 and 34, the reference numeral 122 denotes an SiO₂ insulating film pattern, and 122a denotes an SiO₂ insulating film opening. The length a10 of the SiO₂ insulating film opening 122a corresponds to the exposure width of EB, 10 μm, and the width w10 of the SiO₂ insulating film opening 122a corresponds to the ½ the EB exposure pitch p10, 1000 Å.

In FIG. 34, the reference numeral 101 denotes an n-InP substrate, 102 denotes an n-InP clad layer, 103 denotes an n-AlInAs clad layer, 104 denotes an n-AlGaInAs light-confinement layer, 105 denotes an AlGaInAs quantum-well layer, 106 denotes a p-AlGaInAs light-confinement layer, 107 denotes a p-AlInAs clad layer, 108 denotes a p-InP layer, 110 denotes a p-InGaAsP layer, and 121 denotes a p-InP layer.

Next, referring to FIGS. 35, 36, and 37, a resist is applied onto the SiO₂ insulating film pattern 122, and a resist pattern 124 having a resist pattern opening 124a is formed using photoengraving along the row of the SiO₂ insulating film openings 122a. The result of this step is shown in FIGS. 35, 36, 37, and 38.

In FIG. 35, the width w20 of a resist pattern opening 124a is 1.8 μm, which is the same as the width of the optical-wave guide ridge formed later.

FIG. 37 shows a cross section of the portion where the p-InP layer 121 is covered with the SiO₂ insulating film pattern 122; and FIG. 38 shows a cross section of the portion where an area of the p-InP layer 121 is not covered with the SiO₂ insulating film pattern 122, and exposed on the surface at the width w20 of the resist pattern opening 124a.

Next, areas of the p-InP layer 121 and the p-InGaAsP layer 110 not covered by the SiO₂ insulating film pattern 122 and the resist pattern 124, that is the area exposed on the surface in the sectional view of FIG. 38 are etched by dry etching using the SiO₂ insulating film pattern 122 and the resist pattern 124 as a mask, and using methane gas and hydrogen plasma as etching media, to expose the p-InP layer 108. Then, the SiO₂ insulating film pattern 122 and the resist pattern 124 are removed. The result is shown in FIGS. 39 and 40.

Thereafter, a p-InP layer is grown and filled to form a diffraction grating layer composed of a p-InGaAs/p-InP layer.

In the related-art method for manufacturing a diffraction grating, when dry etching is performed using an SiO₂ insulating film pattern 122 and a resist pattern 124 as a mask and using methane gas and hydrogen plasma as etching media, methane gas and hydrogen plasma, which are etching media, may react with the resist, which is an organic substance, to change the concentration of methane gas and hydrogen plasma, which determine the etching rate; and in some cases, the depth of etching in the direction along the width w20 of the resist pattern opening 124a may lack uniformity.

FIG. 41 is a schematic diagram showing the distribution of depth in the direction along the width w10 of the SiO₂ insulating film openings 122a of a related-art diffraction grating; and FIG. 42 is a schematic diagram showing the distribution of depth in the direction along the width w20 of the resist pattern opening 124a.

As seen from FIG. 42, the depth of the grooves closer to the resist becomes shallow due to the lowered etching rate. Also, since the reaction of the resist with methane and hydrogen plasma changes depending on the surface conditions of the resist, dependence of the etching rate on the surface conditions of the resist may occur, and the etching rate may differ between lots. For this reason, there was difficulty in forming a diffraction grating having an even thickness in the width direction of the ridge wave guide, and fluctuation in the laser characteristics of semiconductor lasers, resulting in lowering of the yield of semiconductor lasers.

The known techniques include Japanese Patent Application Laid-Open No. Hei.6-291408 (1994), which discloses the use of a resist, oxide film, or nitride film as a material of a pattern forming film for forming diffraction gratings.

Japanese Patent Application Laid-Open No. Sho.62-165392 (1987) discloses a method for separately etching regions with inverted periodicity, when a λ/4 shifted diffraction grating is formed, using a patterning layer of an SiO₂ oxide film and a patterning layer of an aluminum film.

Furthermore, Japanese Patent Application Laid-Open No. Sho.62-139503 (1987) discloses a method for forming a diffraction grating in a specific region by forming the mask pattern of a first photoresist having a window corresponding to the specific region laminated with the mask pattern of a second photoresist that does not react with the first photoresist, and by using these two types of mask patterns as masks.

SUMMARY OF THE INVENTION

The present invention has been made to overcome the above-described drawbacks and disadvantages of the related art. It is an object of the present invention to provide a method for manufacturing a semiconductor laser that can easily manufacture a semiconductor laser having diffraction gratings of an even thickness, and having uniform laser characteristics.

According to one aspect of the invention, there is provided a method for manufacturing a semiconductor laser device comprising: a first step of sequentially laminating on a semiconductor substrate of a first conductivity type, a first clad layer of a first conductivity type, an active layer, a first second clad layer of a second conductivity type, a semiconductor layer of the second conductivity type with an index of refraction different from the index of refraction of the second clad layer, and a second second clad layer of the second conductivity type; a second step of forming a first insulating film of a Si-based substance on the surface of the second second clad layer, and forming with the first insulating film a first insulating film pattern with a plurality of first openings which have a strip shape of a predetermined length in the direction intersecting the direction of an optical wave guide, and which are arranged at intervals of a predetermined distance in the direction of an optical wave guide; a third step of forming a second insulating film of a Si-based substance over the semiconductor substrate through the first insulating film pattern, and forming with the second insulating film through the first insulating film pattern a second insulating film pattern with a second opening which has a strip shape extending in the direction of the optical wave guide, and which has a width narrower than the length of the first opening in the direction intersecting the optical wave guide direction; a fourth step of etching the second second clad layer and the semiconductor layer using the second insulating film pattern and the first insulating film pattern as masks to form a third opening passing through the semiconductor layer; and a fifth step of removing the second insulating film pattern and the first insulating film pattern, and filling the second second clad layer and the semiconductor layer through the third opening with a third second clad layer of the second conductivity type. Accordingly, the present invention is advantageous that in manufacturing a semiconductor laser device the reaction of the material for the mask pattern with the etching media is made difficult to occur in etching, and that the unstable variation of the etching rate due to the reaction of the material for the mask pattern with the etching media can be inhibited.

Therefore, since the thickness of the diffraction grating layer can be uniform, a diffraction grating having stable optical characteristics can be formed, and a DFB laser of stable laser characteristics can be formed. Thus, a DFB laser having favorable laser characteristics can be provided at a low price.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

First Embodiment

Figure 1:
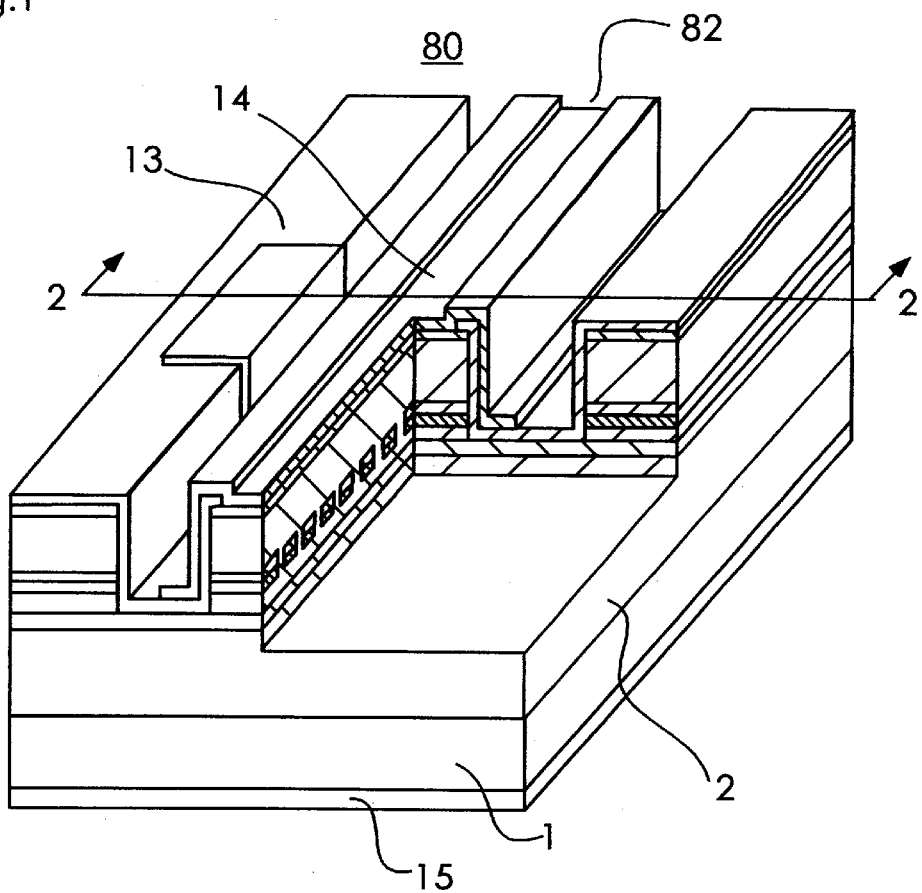
FIG. 1 is a partly cutaway perspective view of a semiconductor laser according to an embodiment of the present invention.
Figure 2:
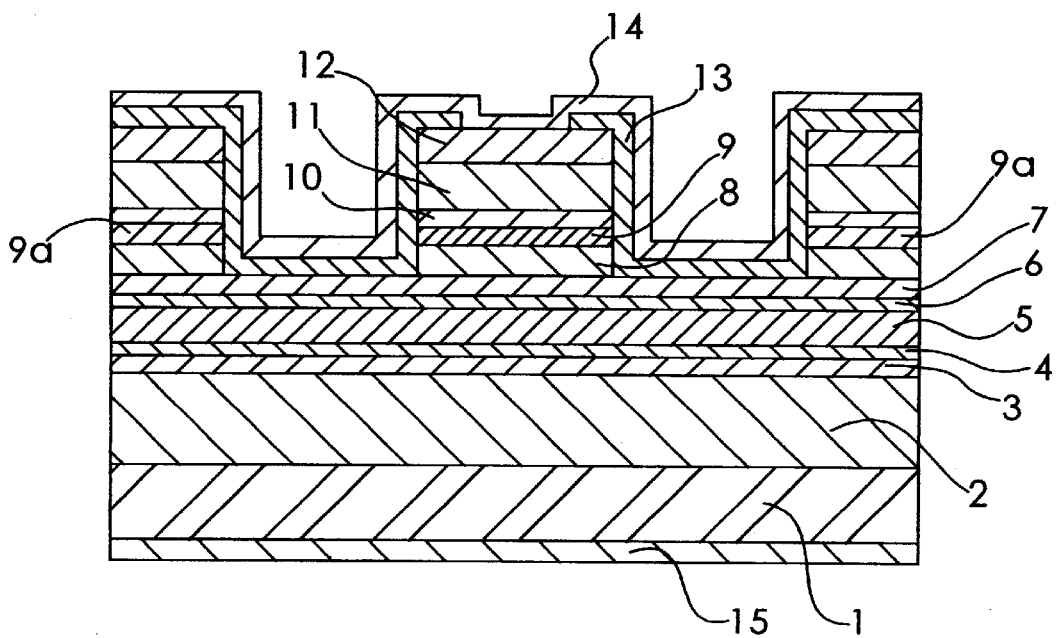
FIG. 2 is a sectional view of the 2—2 cross section of the semiconductor laser of FIG. 1.

In FIGS. 1 and 2, the reference numeral 80 denotes a DFB laser comprising a optical-wave guide ridge according to Embodiment 1, and 82 denotes a optical-wave guide ridge extending to the radiating direction of the laser beams in the central portion of the semiconductor laser 80.

The reference numeral 1 denotes an n-InP substrate as a semiconductor substrate of the first conductivity type; 2 denotes a first n-clad layer of n-InP having a thickness of 1 $\mu$m and a carrier concentration of $N=1\times10^{18}$ cm$^{-3}$ as a first clad layer of the first conductivity type disposed on the n-InP substrate 1; 3 denotes an n-AlInAs clad layer having a thickness of 0.1 μm and a carrier content of N=1×10$^{18}$ cm$^{-3}$ disposed on the n-first clad layer 2; 4 denotes an n-light-confinement layer of n-AlGaInAs having a thickness of 0.1 μm and a carrier content of N=1×10$^{18}$ cm$^{-3}$ as a first light-confinement layer of the first conductivity type disposed on the n-AlInAs clad layer 3; and 5 denotes a quantum-well layer of AlGaInAs as an active layer. Although the active layer of a quantum-well structure is used in Embodiment 1, a bulk active layer may also be used.

The reference numeral 6 denotes a p-light-confinement layer of p-AlGaInAs having a thickness of 0.1 μm and a carrier content of N=1×10$^{18}$ cm$^{-3}$ as a second light-confinement layer of the second conductivity type disposed on the quantum-well layer 5; and 7 denotes a p-AlInAs clad layer having a thickness of 0.1 μm and a carrier content of N=1×10$^{18}$ cm$^{-3}$ disposed on the p-light-confinement layer 6.

The reference numeral 8 denotes a first p-clad layer of p-InP having a thickness of 0.1 μm and a carrier content of N=1×10$^{18}$ cm$^{-3}$ as a first second clad layer of the second conductivity type on the lowermost layer of the optical-wave guide ridge 82; and 9 denotes a diffraction-grating layer composed of a p-InGaAsP layer 9a and a p-InP layer 9b (hereinafter the constitution of the p-InGaAsP layer 9a and a p-InP layer 9b is described as "p-InGaAsP/p-InP"), and disposed on the first p-clad layer 8. The diffraction-grating layer 9 has a periodical structure with a pitch p1 of 2000 Å in the direction of the optical wave guide, and the p-InGaAsP layers 9a and the p-InP layers 9b are alternately disposed at the pitch of p1/2, i.e., 1000 Å. The p-InGaAsP layers 9a has a thickness of 0.06 μm and a carrier content of N=1×10$^{18}$ cm$^{-3}$.

The reference numeral 10 denotes a second p-clad layer composed of p-InP disposed on the diffraction-grating layer 9 as a second second clad layer of a second conductivity type; 11 denotes a third p-clad layer composed of p-InP disposed on the second p-clad layer 10 as a third second clad layer of a second conductivity type having a thickness of 1.5 μm and a carrier content of N=1×10$^{18}$ cm$^{-3}$; and 12 denotes a contact layer composed of p-InGaAs having a thickness of 0.1 μm and a carrier content of N=1×10$^{19}$ cm$^{-3}$. The optical-wave guide ridge 82 is composed of a first p-clad layer 8, a diffraction grating layer 9, a second p-clad layer 10, a third p-clad layer 11, and a contact layer 12, and the width of the optical-wave guide ridge 82 is 1.8 μm.

The reference numeral 13 denotes an SiO$_2$ insulating film that covers the surface of the semiconductor laser and having an opening 13a disposed on the apex of the optical-wave guide ridge 82, the opening 13a to be a current path extending in the direction of the optical wave guide; 14 denotes a p-type electrode of the semiconductor laser 80 composed of a Ti layer and an Au layer; and 15 denotes an n-type electrode of the semiconductor laser 80 composed of an Au layer, a Ge layer, an Ni layer, and an Au layer disposed on the back surface of the n-InP substrate 1.

Next, a method for manufacturing the semiconductor laser 80 will be described.

FIGS. 3, 4, 6, 7, 9, 11, 13, 14, 16, 17, 19, 20, 22, 23, 24, 27, 28, 29, 30, 31, and 32 are sectional views of a semiconductor laser in each step of the method for manufacturing the semiconductor laser according to an embodiment of the present invention; FIGS. 5, 8, and 21 are plans of a semiconductor laser in each step of the method for manufacturing the semiconductor laser according to an embodiment of the present invention; and FIGS. 10, 12, 15, and 18 are partly transparent plans of a semiconductor laser in each step of the method for manufacturing the semiconductor laser according to an embodiment of the present invention. Oblique lines in these plans and partly transparent plans do not show cross sections, but are drawn for clarifying each layer.

Figure 5:
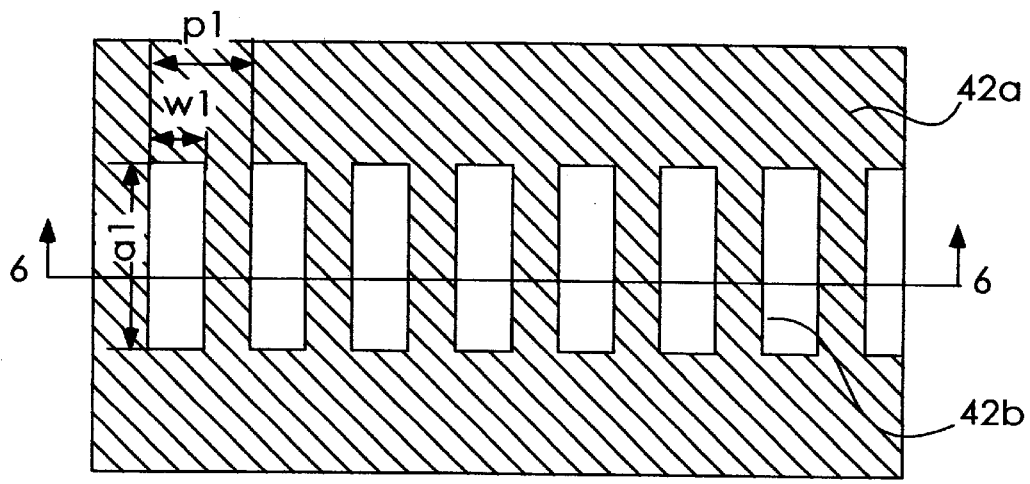
FIGS. 5, 8, and 21 are plans of a semiconductor laser in each step of the method for manufacturing the semiconductor laser according to an embodiment of the present invention.
Figure 6:
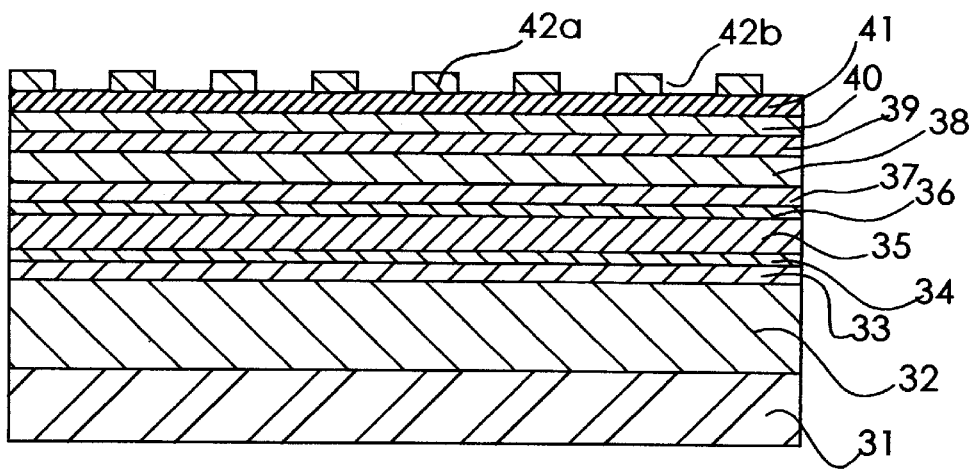
Figure 8:
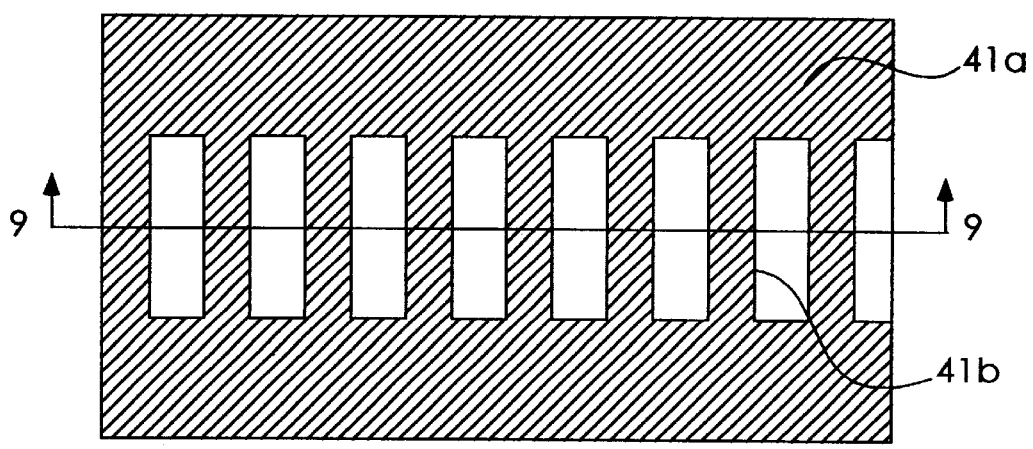
Figure 9:
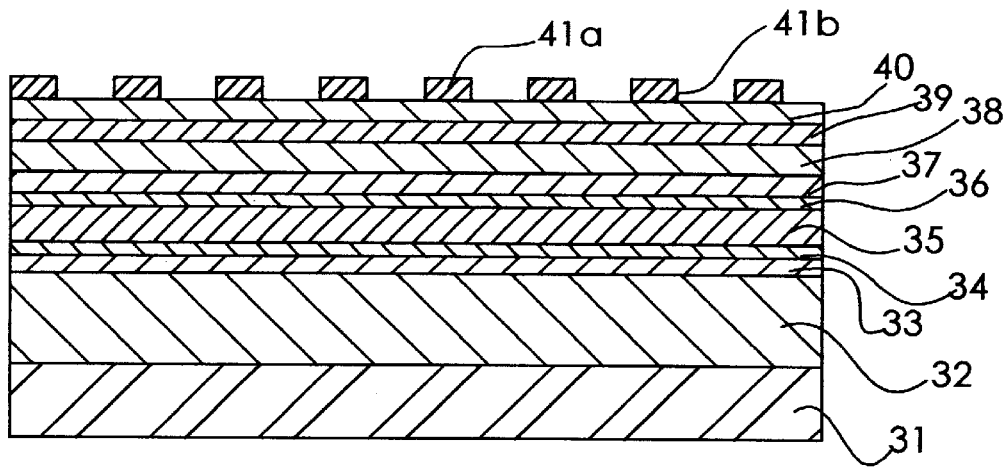
Figure 10:
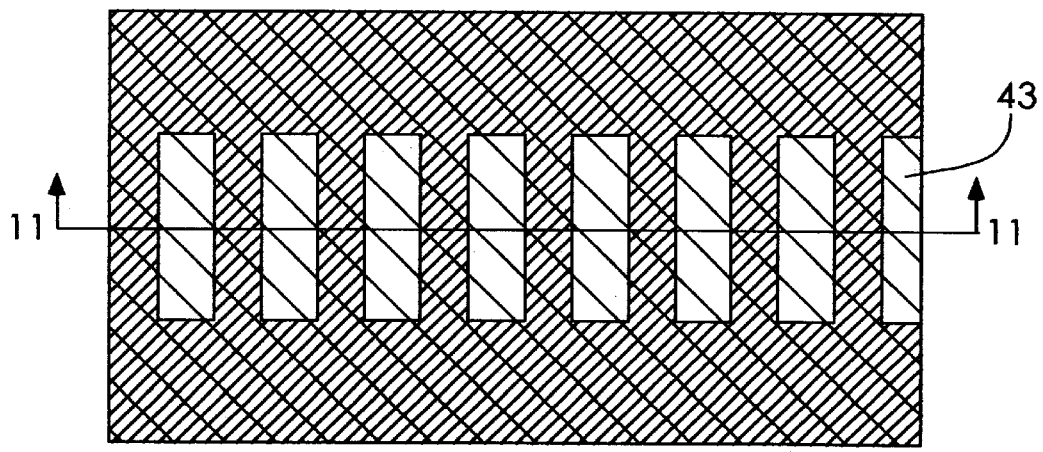
FIGS. 10, 12, 15, and 18 are partly transparent plans of a semiconductor laser in each step of the method for manufacturing the semiconductor laser according to an embodiment of the present invention.
Figure 11:
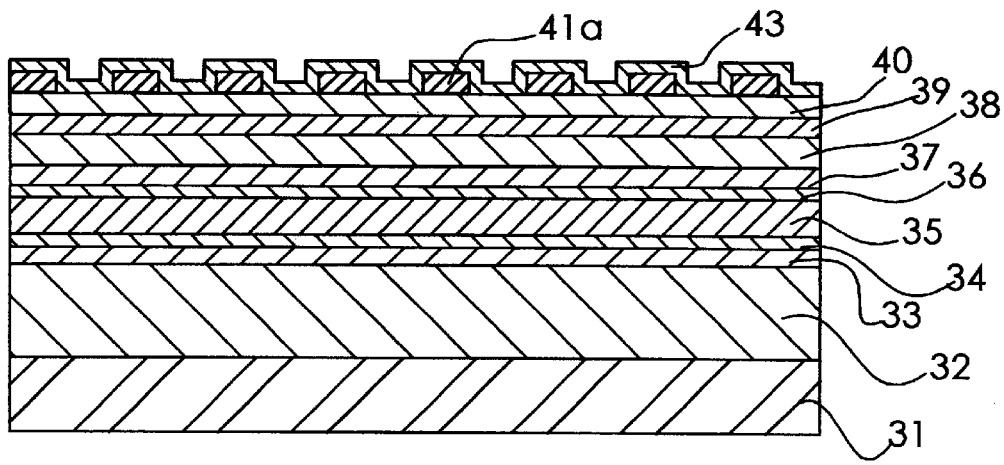
Figure 13:
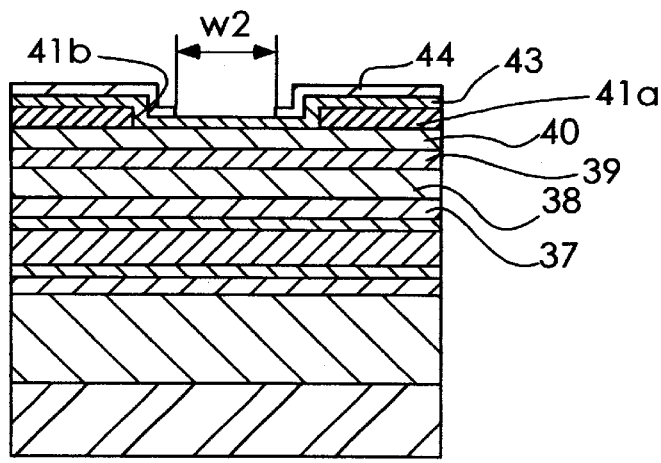
Figure 14:
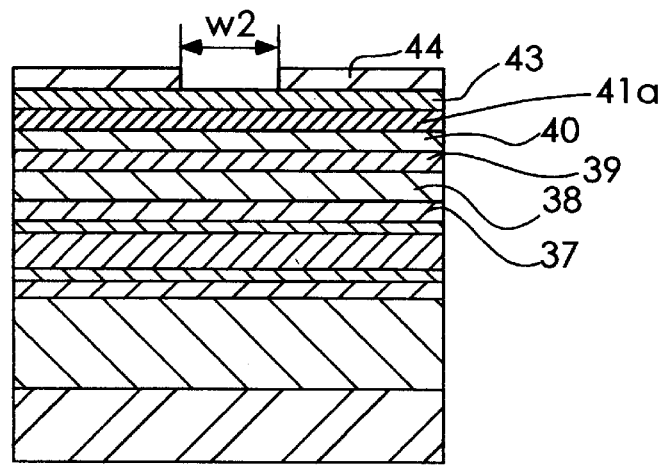
Figure 21:
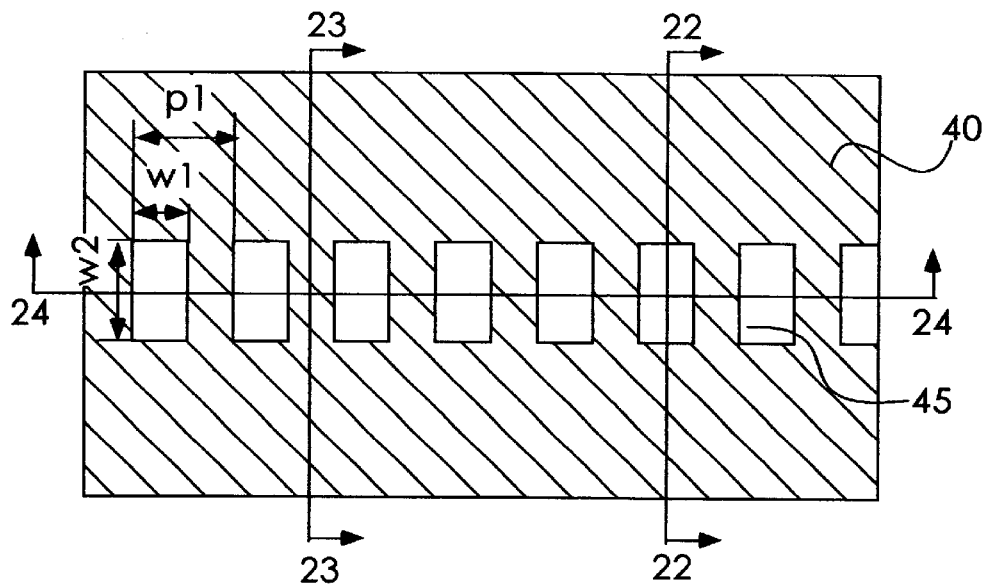
Figure 22:
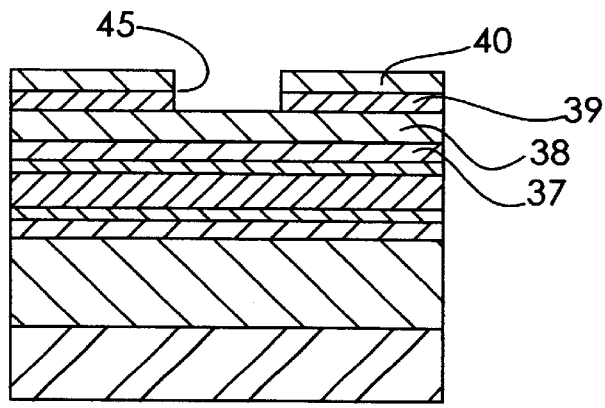
Figure 23:
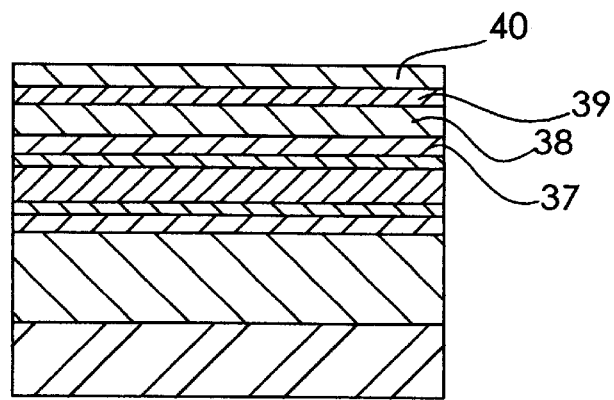
Figure 24:
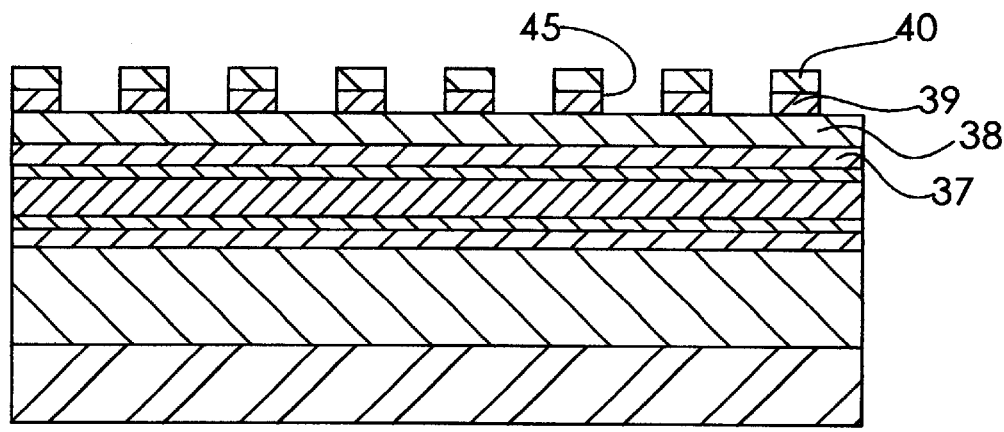

FIG. 6 is a sectional view of the 6—6 cross section of FIG. 5; FIG. 9 is a sectional view of the 9—9 cross section of FIG. 8; FIG. 11 is a sectional view of the 11—11 cross section of FIG. 10; FIG. 13 is a sectional view of the 13—13 cross section of FIG. 12; FIG. 14 is a sectional view of the 14—14 cross section of FIG. 12; FIG. 16 is a sectional view of the 16—16 cross section of FIG. 15; FIG. 17 is a sectional view of the 17—17 cross section of FIG. 15; FIG. 19 is a sectional view of the 19—19 cross section of FIG. 18; FIG. 20 is a sectional view of the 20—20 cross section of FIG. 18; FIG. 22 is a sectional view of the 22—22 cross section of FIG. 21; FIG. 23 is a sectional view of the 23—23 cross section of FIG. 21; and FIG. 24 is a sectional view of the 24—24 cross section of FIG. 21.

FIGS. 3, 4, 6, 7, 9, 11, and 24 are sectional views of cross sections in the direction along the optical wave guide; FIGS. 13, 14, 16, 17, 19, 20, 22, 23, 27, 28, 29, 30, 31, and 32 are sectional views of cross sections in the direction orthogonal to the optical wave guide.

Figure 3:
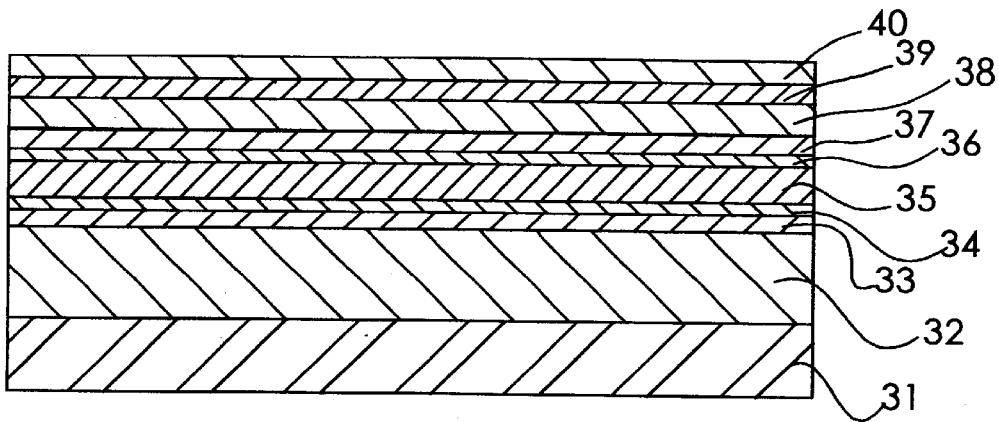
FIGS. 3, 4, 6, 7, 9, 11, 13, 14, 16, 17, 19, 20, 22, 23, 24, 27, 28, 29, 30, 31, and 32 are sectional views of a semiconductor laser in each step of the method for manufacturing the semiconductor laser according to an embodiment of the present invention.

As FIG. 3 shows, on an n-InP substrate 31 to be an n-InP substrate 1, an n-InP layer 32 as an n-first clad layer 2, an n-AlInAs layer 33 as an n-AlInAs clad layer 3, an n-AlGaInAs layer 34 as an n-light-confinement layer 4, an AlGaInAs quantum-well layer 35 as a quantum-well layer 5, a p-AlGaInAs layer 36 as a p-light-confinement layer 6, a p-AlInAs layer 37 as a p-AlInAs clad layer 7, a p-InP layer 38 as a first p-clad layer 8, a p-InGaAsP layer 39 that composes one of a diffraction-grating layer 9 of p-InGaAsP/p-InP, and a p-InP layer 40 as a second p-clad layer 10, are sequentially grown and laminated by, for example, an MOCVD method. Markers (not shown) are formed by etching on the wafer for aligning of photoengraving.

Figure 4:
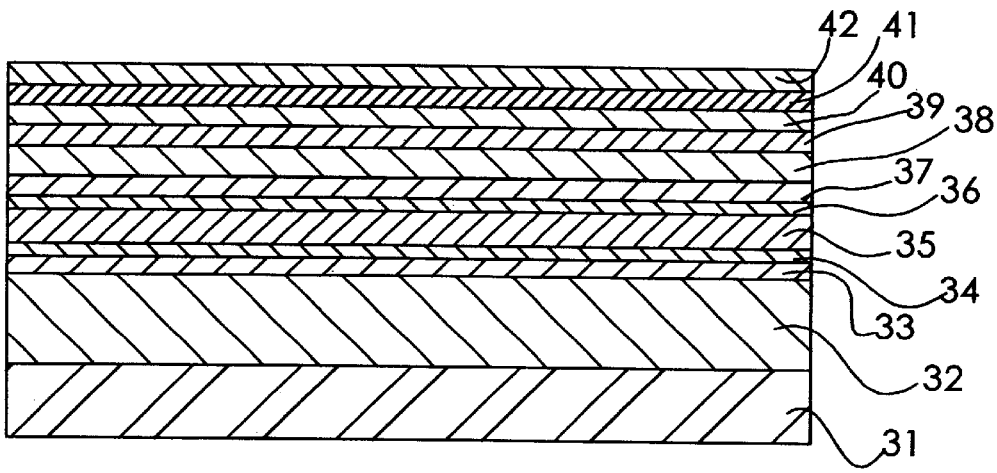

Next, as FIG. 4 shows, an SiO$_2$ insulating film 41 is formed on the surface of a p-InP layer 40 using, for example, plasma CVD, and a resist film 42 is applied to the surface of the SiO$_2$ insulating film 41.

Next, as FIGS. 5 and 6 show, EB exposure is periodically performed to a rectangular region of a length a1 of 10 μm and a width w1 of 1000 Å on the resist film 42 at a pitch p1 of 2000 Å in the direction of the optical wave guide, and development performed to form a resist pattern 42a having a resist film opening 42b.

The width of the diffraction grating layer 9 is 1.8 μm, and the length a1 of the resist film opening 42b is of 10 μm, significantly longer than the width of the diffraction grating layer 9. This is because if the length of the resist film opening 42b is made shorter at the beginning, patterning cannot be performed accurately.

Figure 7:
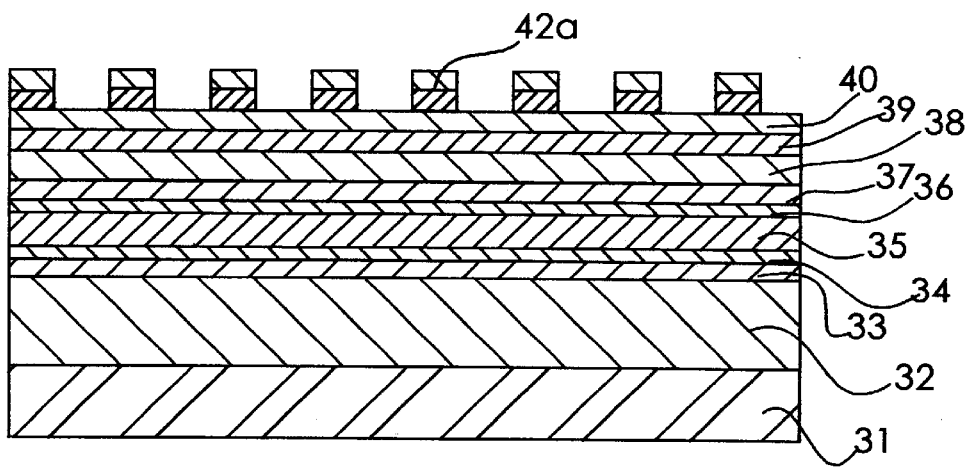

Next, as FIG. 7 shows, dry etching is performed using the resist pattern 42a as the mask and CHF$_3$ and O$_2$ gas as etching media to completely remove the SiO$_2$ insulating film 41 and expose the p-InP layer 40.

Next, as FIGS. 8 and 9 show, the resist pattern 42a is removed. Thereby, an SiO$_2$ insulating film pattern 41a having an SiO$_2$ insulating film opening 41b is formed. Next, as FIGS. 10 and 11 show, an SiN insulating film 43 is formed on the entire surface through the SiO$_2$ insulating film pattern 41a for example by the plasma CVD. In FIG. 10, the SiN insulating film 43 is shown as a transparent layer with oblique lines.

Figure 12:
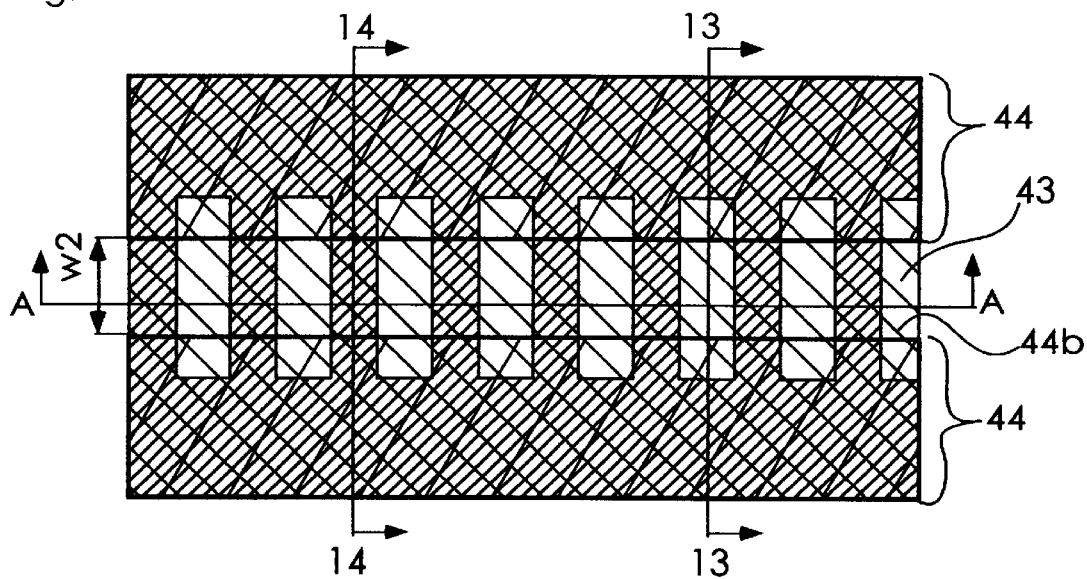

Next, as FIG. 12 shows, a resist film is applied to the surface of the SiN insulating film 43, and a resist pattern 44 having resist film openings 44b of the same width as the optical wave guide ridge 82, immediately above the row of the SiO₂ insulating film openings 41b, in the direction of the optical wave guide, by photoengraving using a stepper referring to the initially formed marker. The opening width w2 of a resist film opening 44b is about 1.8 μm.

FIG. 13 is a sectional view of the portion where an SiO₂ insulating film opening 41b is present, and FIG. 14 is a sectional view of the portion where the SiO₂ insulating film opening 41b is absent. The A—A cross section, which is a cross section in the direction of the optical wave guide of FIG. 12 is the same as the cross section of FIG. 11.

Figure 15:
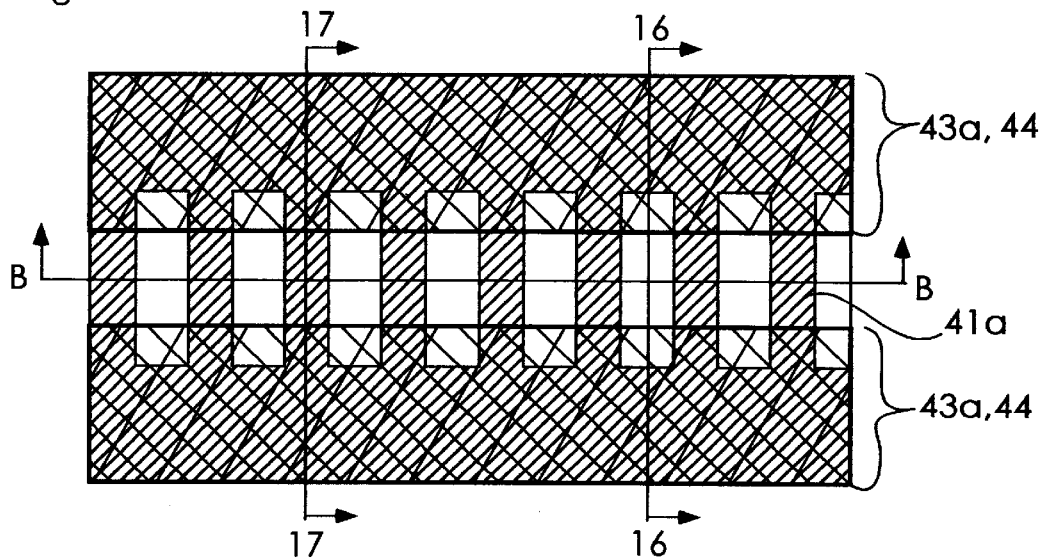
Figure 16:
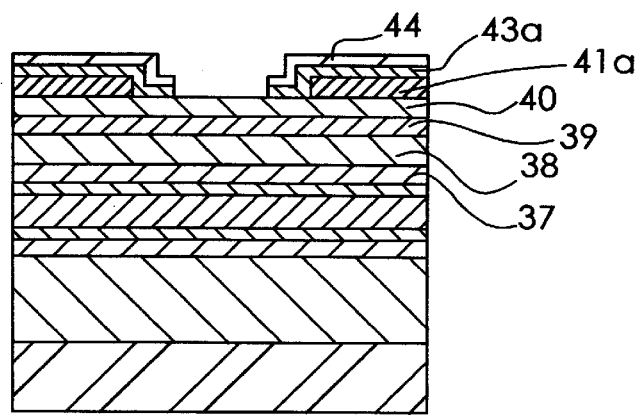
Figure 17:
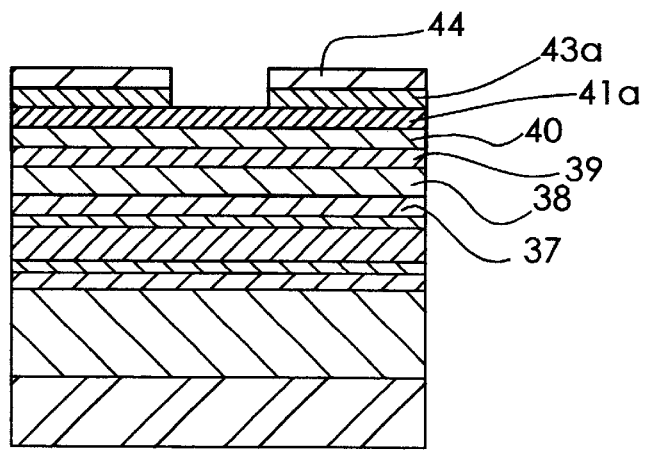

Next, as FIGS. 15, 16, and 17 show, dry etching of the SiN insulating film 43 is performed using the resist pattern 44 as the mask and a mixed gas of $CHF_3$ and $O_2$ as the etching medium to completely remove the the SiN insulating film 43 leaving the underlying SiO₂ insulating film pattern 41a of the SiN insulating film 43, to form an SiN insulating film pattern 43a having SiN insulating film openings 43b. The opening width of each SiN insulating film opening 43b is w2.

When a mixed gas of $CHF_3$ and $O_2$ is used, since the etching rate of the SiN insulating film 43 is about three times faster than the etching rate of the SiO₂ insulating film pattern 41a, etching can be controlled easily by the etching time, enabling stable dry etching.

FIG. 16 is a sectional view of the portion where an SiO₂ insulating film opening 41b is present, and FIG. 17 is a sectional view of the portion where the SiO₂ insulating film opening 41b is absent. In FIG. 15, the SiN insulating film pattern 43a and the resist pattern 44 are shown as transparent layers each with oblique lines. The B—B cross section, which is a cross section in the direction of the optical wave guide of FIG. 15, is the same as the cross section of FIG. 9.

Figure 18:
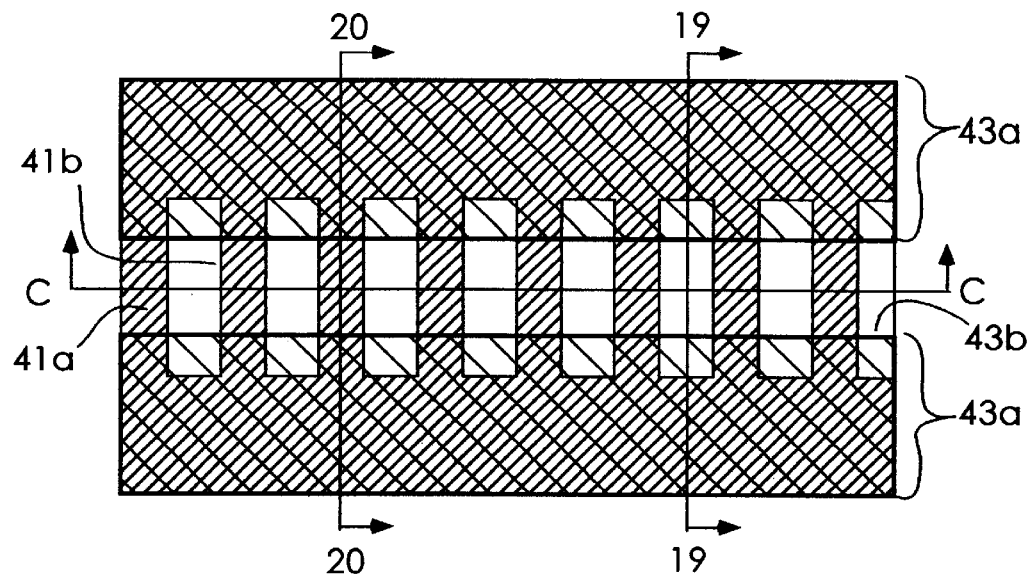
Figure 19:
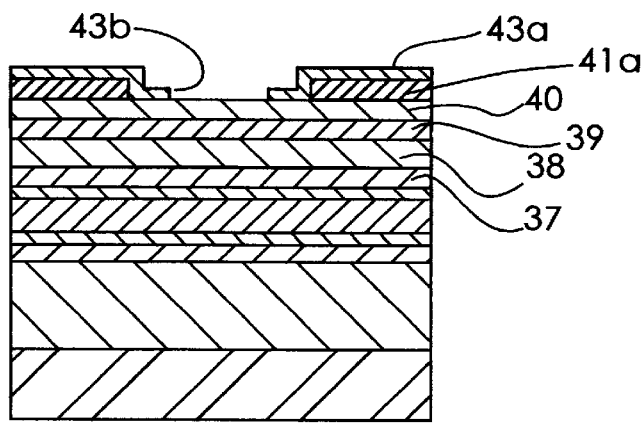
Figure 20:
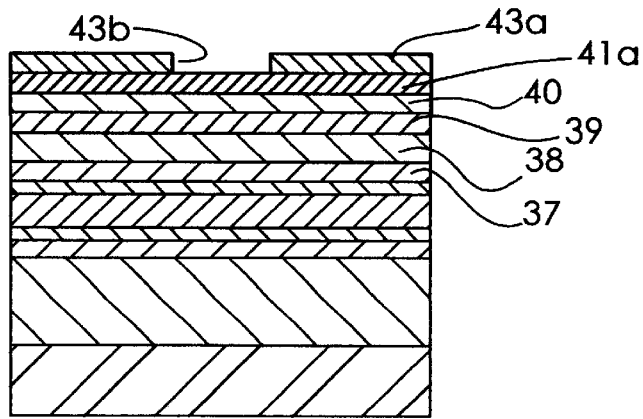

The resist pattern 44 is then removed as shown in FIGS. 18, 19, and 20. FIG. 19 is a sectional view of the portion where the SiO₂ insulating film opening 41b is present and FIG. 20 is a sectional view of the portion where the SiO₂ insulating film opening 41b is absent. In FIG. 18, the SiN insulating film pattern 43a is a transparent layer as diagonally shaded.

Next, as FIGS. 21, 22, 23, and 24 show, the p-InP layer 40 and the p-InGaAsP layer 39 are etched off using the SiN insulating film pattern 43a and the SiO₂ insulating film pattern 41a as the masks, and methane gas and hydrogen plasma as the etching media to expose the p-InP layer 38 through the resultant openings 45. Thereafter, the SiN insulating film pattern 43a and the SiO₂ insulating film pattern 41a are removed.

FIG. 22 is a sectional view of the portion where an opening 45 is present, and FIG. 23 is a sectional view of the portion where the opening 45 is absent.

The formed openings 45 are rectangular each with a width w1, i.e., 1000 Å, in the direction of the optical wave guide and a length w2, i.e., 1.8 μm, diagonal to the direction of the optical wave guide and are arrayed at intervals of 1000 Å, that is at a pitch of 2000 Å, in the direction of the optical wave guide.

Although the SiN insulating film pattern 43a is used in the step for etching the p-InP layer 40 and the p-InGaAsP layer 39 in this embodiment, a resist pattern is used in the prior art. In the prior art, therefore, methane gas and hydrogen plasma used as etching media react with the resist pattern to make the concentration of the etching media unstable, and adversely affect the etching rate. According to the present invention, by the use of an SiN insulating film pattern 43a, since methane gas and hydrogen plasma used as etching media are difficult to react with the SiN insulating film pattern 43a, the concentration of the etching media during etching is stabilized, and the etching rate is hardly varied. Therefore, the depth of the openings 45 in each lot becomes uniform, and the thickness of the diffraction grating layer 9 in the direction diagonal with the direction of the optical wave guide becomes uniform.

In Embodiment 1, although an SiN insulating film pattern 43a and an SiO₂ insulating film pattern 41a are used as the masks, the SiN insulating film pattern 43a may be replaced by an SiO₂ insulating film pattern.

Figure 25:
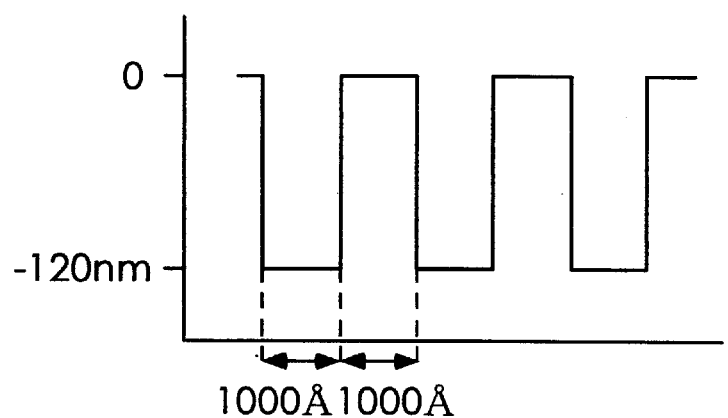
FIGS. 25 and 26 are schematic diagrams showing the depth of openings of a diffraction grating layer for a semiconductor laser according to an embodiment of the present invention.
Figure 26:
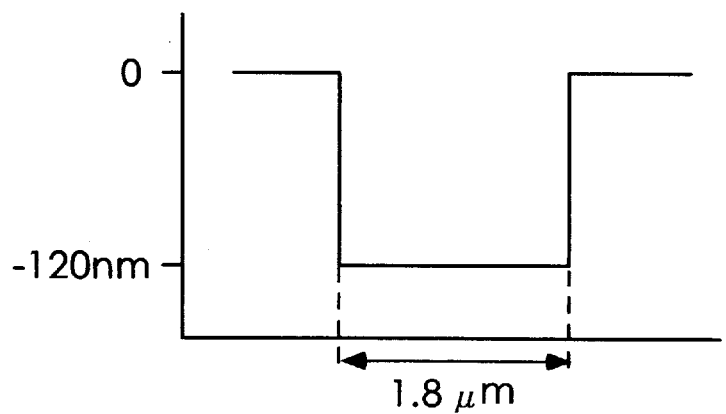

FIGS. 25 and 26 are schematic diagrams showing the depth of openings of a diffraction grating layer for a semiconductor laser according to an embodiment of the present invention.

Figure 41:
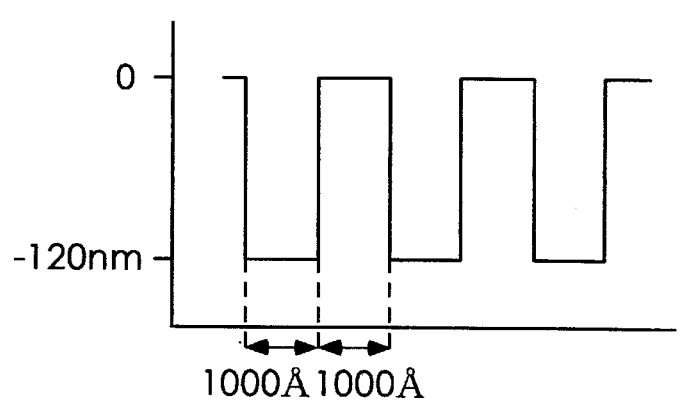
FIG. 41 is a schematic diagram showing the distribution of depth in the direction along the width w10 of the $SiO_2$ insulating film openings 122a of a related-art diffraction grating.
Figure 42:
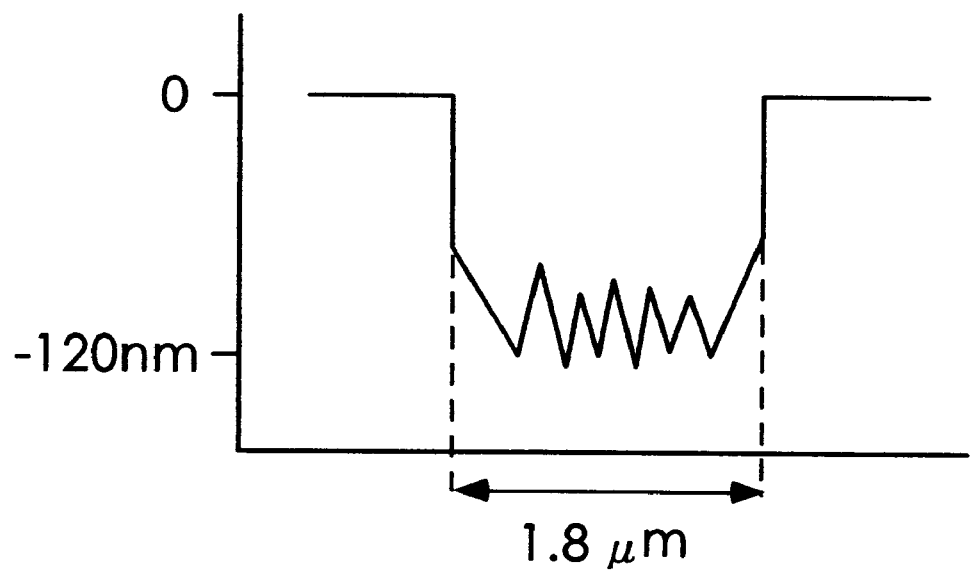
FIG. 42 is a schematic diagram showing the distribution of depth in the direction along the width w20 of the resist pattern opening 124a of a related-art diffraction grating.

Compared with FIGS. 41 and 42 showing the depth and shape of openings of a diffraction grating layer formed by a conventional manufacturing method, it is seen that the openings 45 formed by the manufacturing method according to Embodiment 1 have a uniform depth in the direction diagonal with the direction of the optical wave guide.

Figure 27:
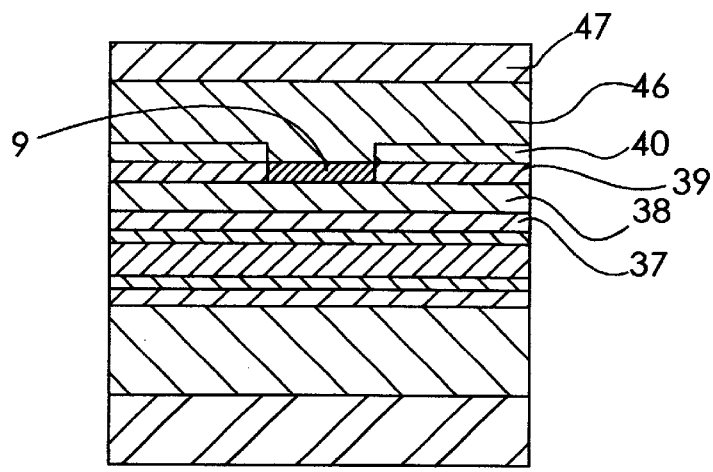

Next, as FIG. 27 shows, a p-InP layer 46, as a third p-clad layer 11, is grown and filled on the surface of the p-InP layer 38 through the opening 45. Thereby, a diffraction grating layer 9 of p-InGaAsP/p-InP is formed. Furthermore, a p-InGaAs layer 47 as the contact layer 12 is formed on the p-InP layer 46.

Figure 28:
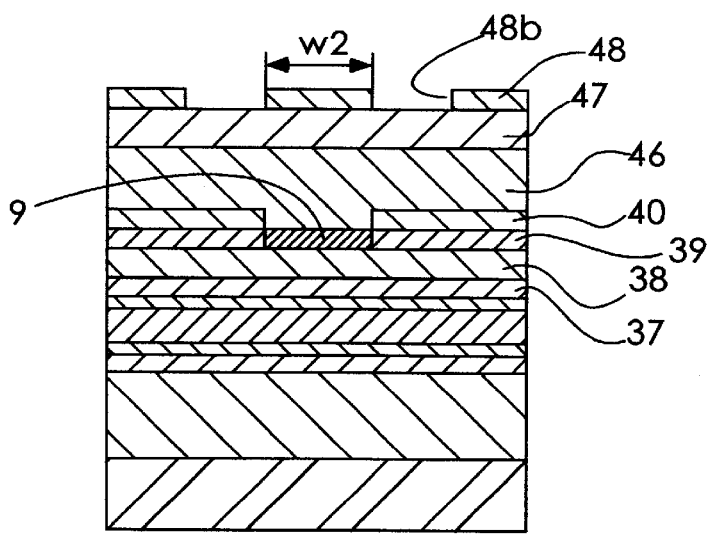

Next, as FIG. 28 shows, an SiO₂ insulating film is formed on the surface of the p-InGaAs layer 47, and an SiO₂ insulating film pattern 48 is formed, the SiO₂ insulating film pattern 48 having a strip-like portion with a width in the direction diagonal with the direction of the optical wave guide of w2, i.e., 1.8 μm, extended in the direction of the optical wave guide, and disposed immediately above the openings 45, and having openings 48b on the both sides of the strip-like portion for forming optical-wave guide ridges 82.

Figure 29:
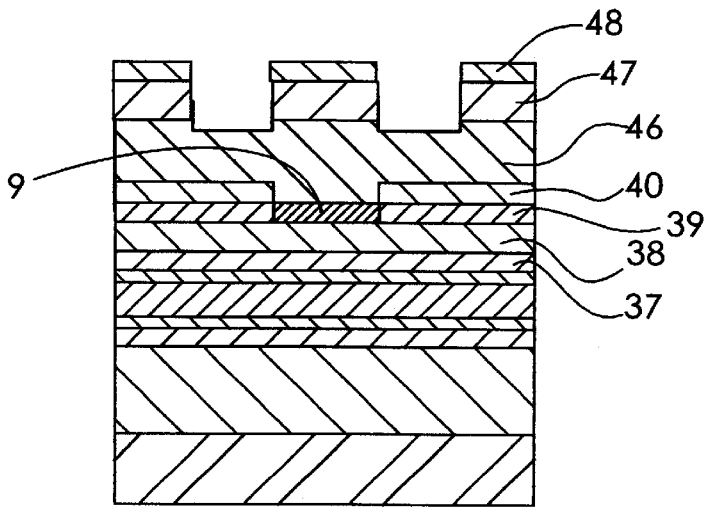

Next, as FIG. 29 shows, the p-InGaAs layer 47 is completely removed by dry etching using the SiO₂ insulating film pattern 48 as the mask, and etching is performed to the middle of the p-InP layer 46.

Figure 30:
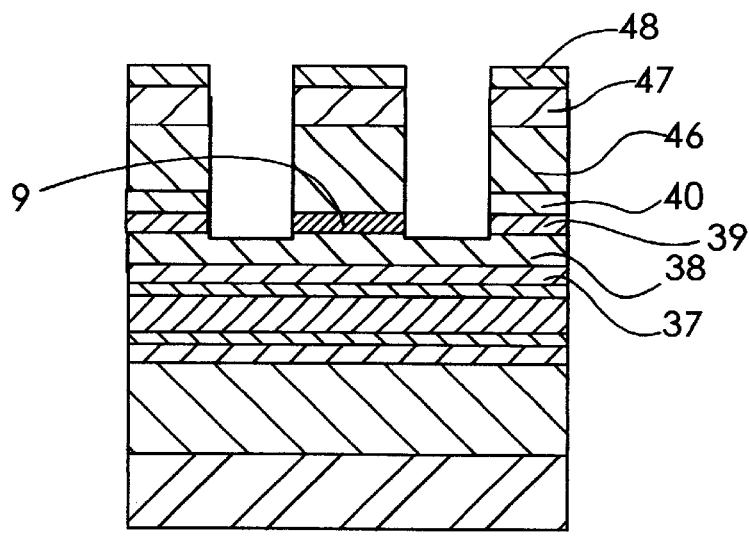

Next, as FIG. 30 shows, the p-InP layer 46 and the p-InP layer 40 are completely removed by wet etching using the SiO₂ insulating film pattern 48 as the mask, and etching is stopped at the p-InGaAsP layer 39.

As an etchant for this etching, for example, a mixed solution of hydrochloric acid and phosphoric acid (hydrochloric acid: phosphoric acid=1:2) is used. By the use of the a mixed solution of hydrochloric acid and phosphoric acid, since the etching selectivity of the InP layer and the InGaAsP layer is large, that is, the etching rate of the InP layer is high and the etching rate of the InGaAsP layer is low, etching can be stopped at the InGaAsP layer 47. When the mixed solution of hydrochloric acid and phosphoric acid is used, etching proceeds only downward, but little proceed in the lateral directions, vertical ridges can be formed.

Furthermore, the p-InGaAsP layer 39 is completely removed by dry etching using the SiO₂ insulating film pattern 48 as the mask, and etching is performed to the middle of the p-InP layer 38.

Figure 31:
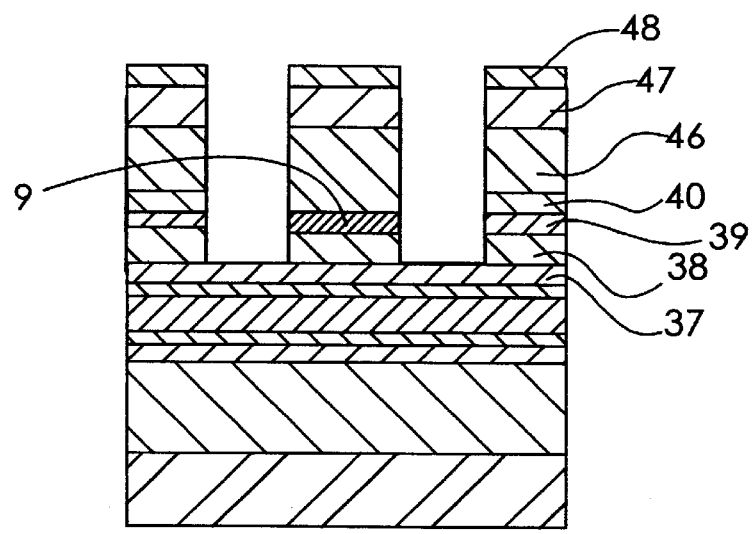

Next, as FIG. 31 shows, the p-InP layer 38 is completely removed by wet etching using the SiO₂ insulating film pattern 48 as the mask, and etching is stopped at the depth a little below the surface of the p-AlInAs layer 37.

As an etchant for this etching, for example, a mixed solution of hydrochloric acid and phosphoric acid (hydrochloric acid: phosphoric acid=1:2) is used. Since the etching rate of the AlInAs layer is a little slower than the etching rate of the InP layer, etching can be stopped at the depth a little below the surface of the p-AlInAs layer 37 by setting the etching time considering the etching rate.

The reason why the length of the openings 45 in the direction diagonal with the direction of the optical wave guide determined as w2, i.e., 1.8 μm, the same as the width of the ridge formed later, is that there is little difference in etching rates between the p-InP layer and the p-AlInAs layer in etching for removing the p-InP layer 38.

That is, in the step for completely removing the p-InP layer 46 and the p-InP layer 40 by wet etching, and stopping the etching at the p-InGaAsP layer 39, since the etching is controlled by the etching time, the etching time is set a slightly longer for over-etching.

Therefore, if the diffraction grating layer 9 of p-InGaAsP/p-InP is formed to be wider than the width of the ridge to be formed later, etching will stop at the portion where the p-InGaAsP layer 39 is present, but will further proceed at the portion where the p-InGaAsP layer 39 is absent.

Thereafter, even if the p-InGaAsP layer 39 is removed by dry etching, the thickness of the p-InP layer 38 is different between the portion where the p-InGaAsP layer 39 was present and the portion where the p-InGaAsP layer 39 was absent, and there is little difference in the etching rate between the p-InP layer and the p-AlInAs layer, the difference in the thickness of the p-InP layer 38 creates the deeply etched portion on the p-AlInAs layer 37 in the time set when the p-InP layer 38 is etched. In this case, since laser characteristics fluctuate easily, the width of the diffraction grating 9 is made the same as the width of the ridge.

Figure 32:
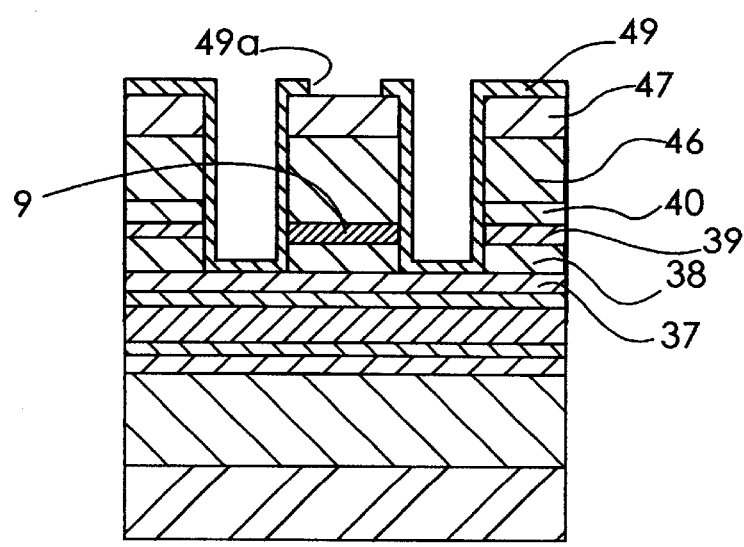
Figure 33:
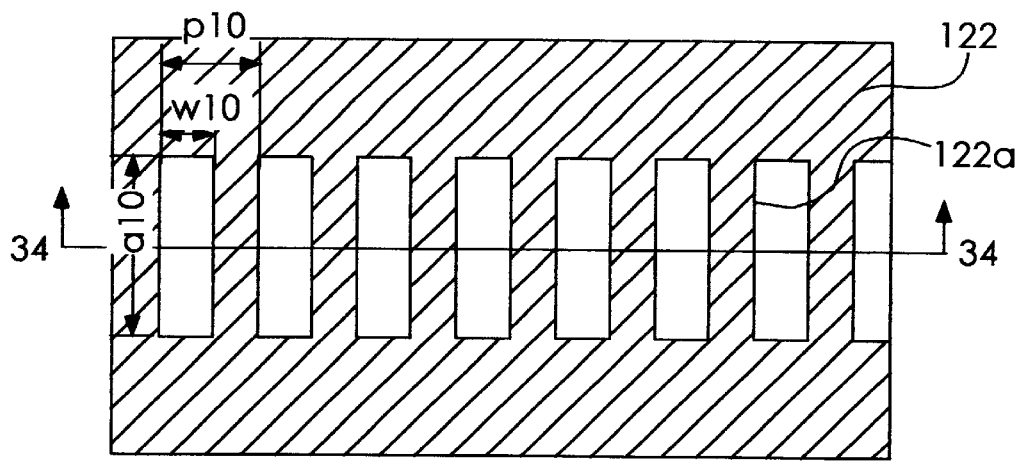
FIGS. 33, 35, and 39 are plans of a semiconductor laser showing a step in a related-art method for manufacturing a semiconductor laser.
Figure 34:
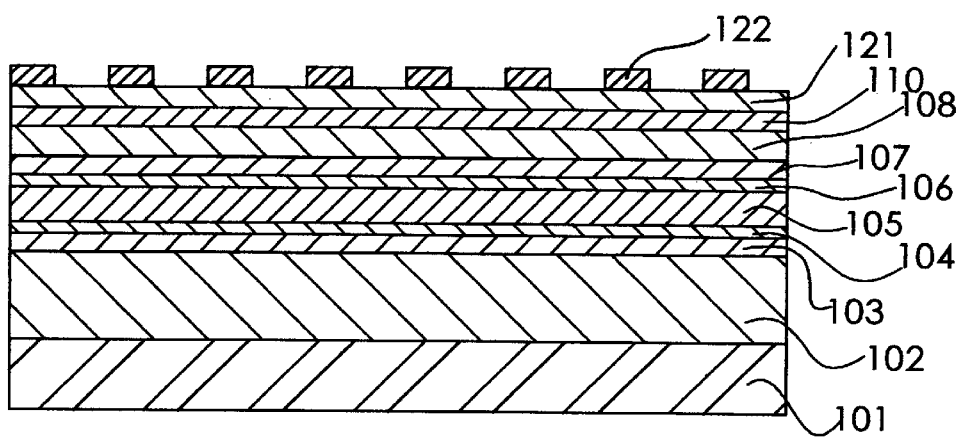
FIG. 34 is a sectional view of the semiconductor laser along line 34—34 in FIG. 33.
Figure 35:
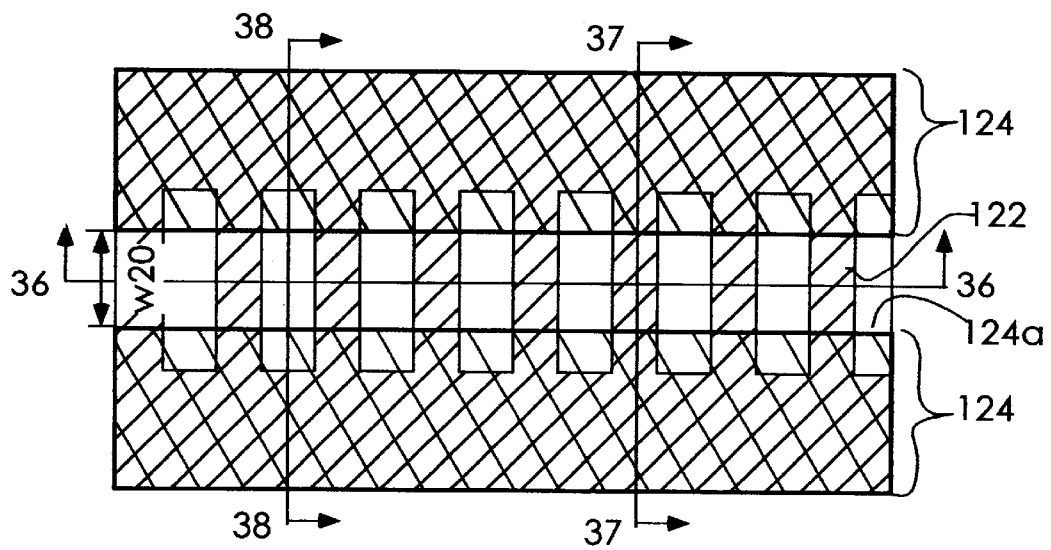
Figure 36:
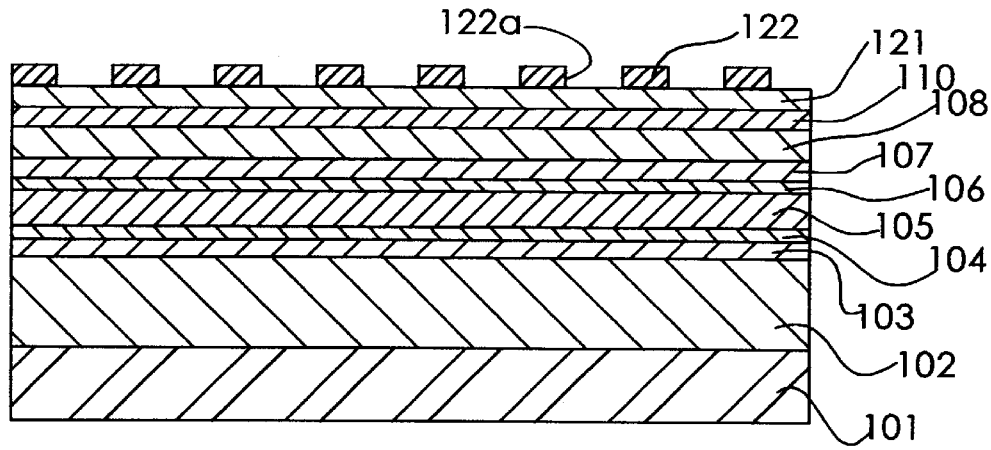
FIG. 36 is a sectional view of the semiconductor laser along line 36—36 in FIG. 35.
Figure 37:
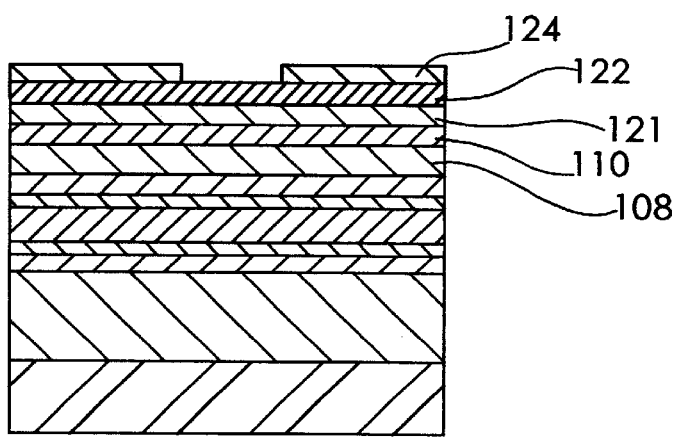
FIG. 37 is a sectional view of the semiconductor laser along line 37—37 in FIG. 35.
Figure 38:
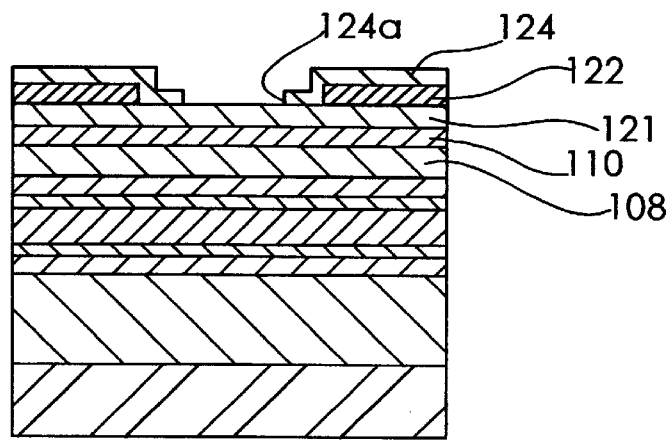
FIG. 38 is a sectional view of the semiconductor laser along line 38—38 in FIG. 35.
Figure 39:
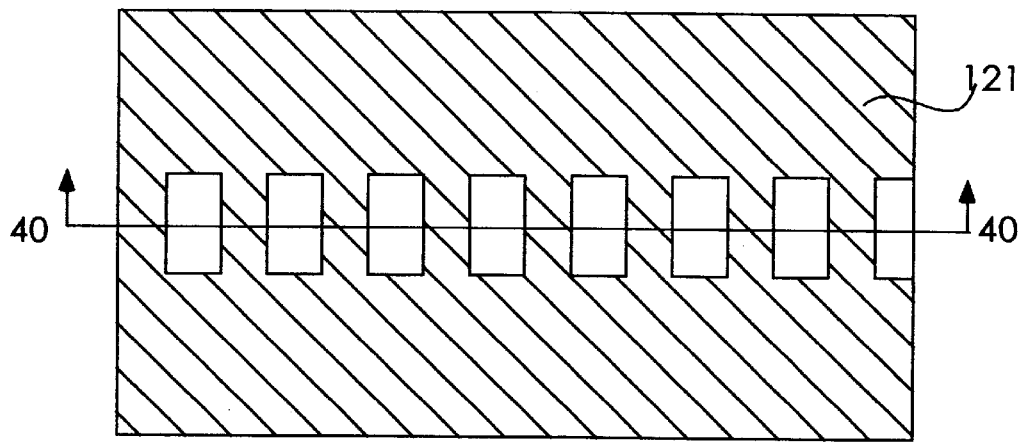
Figure 40:
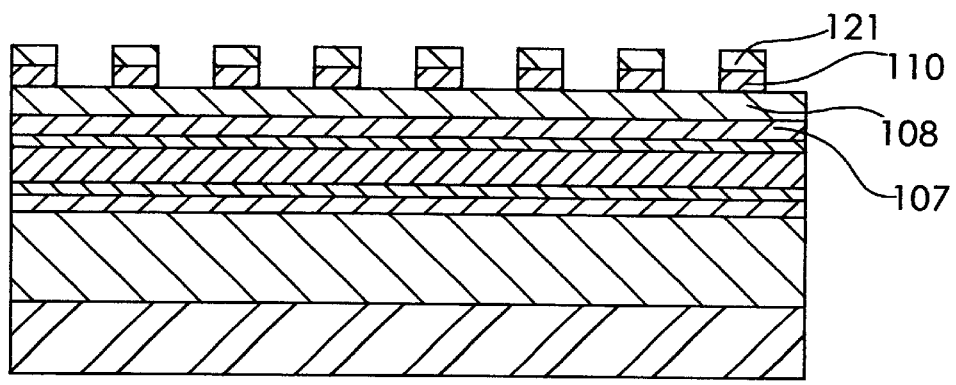
FIG. 40 is a sectional view of the semiconductor laser along line 40—40 in FIG. 39.

Next, as FIG. 32 shows, the $SiO_2$ insulating film pattern 48 is removed, and another $SiO_2$ insulating film 49 is formed on the entire surface of the wafer, and an opening 49a is formed on the apex of the optical-wave guide ridge 82 as a current path.

Further, the p-type electrode of the semiconductor laser 80 composed of a Ti layer and an Au layer formed on the $SiO_2$ insulating film 49, and the n-InP substrate 31 are polished to a predetermined thickness, and an n-type electrode composed of an Au layer, a Ge layer, an Ni layer, and an Au layer is formed on the back surface of the n-InP substrate 31, to complete the semiconductor laser 80 shown in FIGS. 1 and 2.

As described above, in the method for manufacturing a semiconductor laser according to this embodiment, when the diffraction grating layer 9 of p-InGaAsP/p-InP is formed, the p-InP layer 40 and the p-InGaAsP layer 39 are etched off using methane gas and hydrogen plasma as etching media, and using the SiN insulating film pattern 43a and the $SiO_2$ insulating film pattern 41a as the masks in dry etching for forming the openings 45 each having the same width as the optical-wave guide ridge.

Therefore, the reaction of the mask pattern with the etching media can be prevented, the undesirable variation in concentration of the etching media due to the reaction of the mask pattern with the etching media can be prevented, and the unstable variation of the etching rate during etching can be prevented.

Therefore, the depth of the openings 45 formed in the p-InP layer 40 and the p-InGaAsP layer 39 can be made uniform, and the thickness of the diffraction grating layer can be made uniform. Moreover, a diffraction grating having stable optical characteristics can be formed, and a DFB laser comprising a optical-wave guide ridge of stable laser characteristics can be formed. Thus, a semiconductor laser having favorable laser characteristics can be provided at a low price.

Since the method for manufacturing a semiconductor laser device according to the present invention comprises the steps as described above, the following effects can be obtained:

The method for manufacturing a semiconductor laser device according to the present invention comprises: a first step of sequentially laminating on a semiconductor substrate of a first conductivity type, a first clad layer of a first conductivity type, an active layer, a first second clad layer of a second conductivity type, a semiconductor layer of the second conductivity type with an index of refraction different from the index of refraction of the second clad layer, and a second second clad layer of the second conductivity type; a second step of forming a first insulating film of a Si-based substance on the surface of the second second clad layer, and forming with the first insulating film a first insulating film pattern with a plurality of first openings which have a strip shape of a predetermined length in the direction intersecting the direction of an optical wave guide, and which are arranged at intervals of a predetermined distance in the direction of an optical wave guide; a third step of forming a second insulating film of a Si-based substance over the semiconductor substrate through the first insulating film pattern, and forming with the second insulating film through the first insulating film pattern a second insulating film pattern with a second opening which has a strip shape extending in the direction of the optical wave guide, and which has a width narrower than the length of the first opening in the direction intersecting the optical wave guide direction; a fourth step of etching the second second clad layer and the semiconductor layer using the second insulating film pattern and the first insulating film pattern as masks to form a third opening passing through the semiconductor layer; and a fifth step of removing the second insulating film pattern and the first insulating film pattern, and filling the second second clad layer and the semiconductor layer through the third opening with a third second clad layer of the second conductivity type.

In the method for manufacturing a semiconductor laser device, as both the mask pattern having the first openings and the mask pattern having the second opening are formed of insulating films of Si-based substances, the reaction of the material for the mask pattern with the etching media is made difficult to occur in etching, and the unstable variation of the etching rate due to the reaction of the material for the mask pattern with the etching media can be inhibited.

Therefore, since the thickness of the diffraction grating layer can be uniform, a diffraction grating having stable optical characteristics can be formed, and a DFB laser of stable laser characteristics can be formed. Thus, a DFB laser having favorable laser characteristics can be provided at a low price.

Furthermore, in the first step, an active layer is made a quantum-well structure, a first light confinement layer of the first conductivity type is formed between the first clad layer and the active layer, and a second light confinement layer of the second conductivity type is formed between the active layer and the first second clad layer.

In the method for manufacturing a semiconductor laser device having an active layer of a quantum-well structure, as both the mask pattern having the first openings and the mask pattern having the second opening are formed of insulating films of Si-based substances, the reaction of the material for the mask pattern with the etching media is made difficult to occur in etching, and the unstable variation of the etching rate due to the reaction of the material for the mask pattern with the etching media can be inhibited.

Therefore, since the thickness of the diffraction grating layer can be uniform in the semiconductor laser having an active layer of a quantum-well structure, a diffraction grating having stable optical characteristics can be formed, and a DFB laser of stable laser characteristics can be formed. Thus, a DFB laser having favorable laser characteristics can be provided at a low price.

Furthermore, in the third step, since the etching rate of the first insulating film to the predetermined etching medium is lower than the etching rate of the second insulating film, the etching of the second insulating film for forming second openings leaving the first insulating film pattern can be controlled easily. Therefore, the manufacturing process of the diffraction grating can be simplified, and the yield of DFB lasers can be improved.

Furthermore, since the first insulating film is an $SiO_2$ film, and the second insulating film is an SiN film, the etching of the second insulating film for forming second openings leaving the first insulating film pattern can be controlled easily.

Therefore, the manufacturing process of the diffraction grating can be simplified, DFB lasers can be provided at a low price, and the yield of DFB lasers can be improved.

Furthermore, in the fourth step, etching is performed by dry etching using the second insulating film pattern and the first insulating film pattern as masks, and using methane gas and hydrogen plasma as etching media. Since the second insulating film pattern and the first insulating film pattern are difficult to react with the etching media, the concentration of the etching media is stabilized, and the etching rate during dry etching can be stabilized.

Therefore, a diffraction grating having favorable characteristics can be formed efficiently, and a DFB laser having favorable laser characteristics can be provided at a low price.

Furthermore, the method further comprises a step of forming a third insulating film on the third second clad layer, forming with the third insulating film a third insulating film pattern which have a strip-shaped portion opposed to the third opening, of a width corresponding to the length of the third opening and extended in the direction of the optical wave guide, and which have a fourth opening of a predetermined width on the both sides of the strip-shaped portion, and removing the first second clad layer using the third insulating film pattern as the mask to expose a surface of the layer under the first second clad layer.

In the method for manufacturing a semiconductor laser device of a ridge optical wave guide type, as both the mask pattern having the first openings and the mask pattern having the second opening are formed of insulating films of Si-based substances, the reaction of the material for the mask pattern with the etching media is made difficult to occur in etching, and the unstable variation of the etching rate due to the reaction of the material for the mask pattern with the etching media can be inhibited.

Therefore, since the thickness of the diffraction grating layer can be uniform in the DFB laser of a ridge optical wave guide type, a diffraction grating having stable optical characteristics can be formed, and a DFB laser comprising a optical-wave guide ridge of stable laser characteristics can be formed. Thus, a ridge optical-wave guide type DFB laser having favorable laser characteristics can be provided at a low price.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A method for manufacturing a semiconductor laser device comprising:

sequentially laminating on a semiconductor substrate of a first conductivity type, a first cladding layer of a first conductivity type, an active layer, a first second cladding layer of a second conductivity type, a semiconductor layer of the second conductivity type with an index of refraction different from the index of refraction of the second cladding layer, and a second second cladding layer of the second conductivity type;

forming a first insulating film of a Si-based substance on the second second cladding layer, and forming, with the first insulating film, a first insulating film pattern with a plurality of first openings which have a strip shape having a length in a direction intersecting an optical wave guide, and arranged at an interval having a predetermined distance along the optical wave guide;

forming a second insulating film of a Si-based substance over the semiconductor substrate through the first insulating film pattern, and forming with the second insulating film, through the first insulating film pattern, a second insulating film pattern with a second opening which has a strip shape extending along the optical wave guide, and which has a width narrower than the length of the first opening in the direction intersecting the optical wave guide;

etching the second second cladding layer and the semiconductor layer using the second insulating film pattern and the first insulating film pattern as masks to form a third opening passing through the semiconductor layer; and removing the second insulating film pattern and the first insulating film pattern, and filling the second second cladding layer and the semiconductor layer through the third opening with a third second cladding layer of the second conductivity type.

2. The method for manufacturing a semiconductor laser device according to claim 1, wherein sequentially laminating includes forming an active layer is having a quantum-well structure, a first light confinement layer of the first conductivity type between the first cladding layer and the active layer, and a second light confinement layer of the second conductivity type between the active layer and the first second cladding layer.

3. The method for manufacturing a semiconductor laser device according to claim 1, wherein, in forming the second insulating film, etching of the first insulating film is slower than etching of the second insulating film.

4. The method for manufacturing a semiconductor laser device according to claim 3, wherein the first insulating film is an $SiO_2$ film, and the second insulating film is an SiN film.

5. The method for manufacturing a semiconductor laser device according to claim 1, wherein, in etching the second second cladding layer, etching is dry etching using the second insulating film pattern and the first insulating film pattern as masks, and using methane gas and a hydrogen plasma as etching media.

6. The method for manufacturing a semiconductor laser device according to claim 1, further comprising forming a third insulating film on the third second cladding layer, forming, with the third insulating film, a third insulating film pattern which has a strip-shaped portion opposed to the third opening, having a width corresponding to the length of the third opening and extending along the optical wave guide, and which has a fourth opening having a width on both sides of the strip-shaped portion, and removing the first second cladding layer using the third insulating film pattern as the mask to expose a surface of the layer under the first second cladding layer.

* * * * *